US006872666B2

(12) United States Patent  
Morrow

(10) Patent No.: US 6,872,666 B2  
(45) Date of Patent: Mar. 29, 2005

(54) METHOD FOR MAKING A DUAL DAMASCENE INTERCONNECT USING A DUAL HARD MASK

(75) Inventor: Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 338 days.

(21) Appl. No.: 10/289,807

(22) Filed: Nov. 6, 2002

(65) Prior Publication Data

US 2004/0087166 A1 May 6, 2004

(51) Int. Cl.[7] .............................................. H01L 21/311
(52) U.S. Cl. ........................ 438/700; 438/723; 438/725
(58) Field of Search ................................ 438/700, 702, 438/717, 723, 724, 725, 618, 622

(56) References Cited

U.S. PATENT DOCUMENTS

| | | | | |
|---|---|---|---|---|
| 4,587,138 | A | | 5/1986 | Yau et al. ....................... 427/88 |
| 4,910,122 | A | | 3/1990 | Arnold et al. ................ 430/313 |
| 5,892,096 | A | | 4/1999 | Meador et al. .............. 558/393 |
| 6,033,977 | A | | 3/2000 | Gutsche et al. ............. 438/618 |
| 6,037,255 | A | | 3/2000 | Hussein et al. ............. 438/675 |
| 6,042,999 | A | * | 3/2000 | Lin et al. ..................... 430/316 |
| 6,057,239 | A | | 5/2000 | Wang et al. ................. 438/689 |
| 6,066,569 | A | | 5/2000 | Tobben ........................ 438/717 |
| 6,153,521 | A | * | 11/2000 | Cheung et al. .............. 438/687 |
| 6,156,643 | A | | 12/2000 | Chan et al. .................. 438/638 |
| 6,184,142 | B1 | | 2/2001 | Chung et al. ................ 438/692 |
| 6,291,887 | B1 | | 9/2001 | Wang et al. ................. 257/758 |
| 6,303,523 | B2 | | 10/2001 | Cheung et al. ............. 438/780 |
| 6,309,962 | B1 | | 10/2001 | Chen et al. .................. 438/638 |
| 6,312,874 | B1 | | 11/2001 | Chan et al. .................. 430/314 |
| 6,329,118 | B1 | | 12/2001 | Hussein et al. ........... 430/270.1 |
| 6,350,700 | B1 | * | 2/2002 | Schinella et al. ............ 438/723 |
| 6,365,527 | B1 | | 4/2002 | Yang et al. .................. 438/761 |
| 6,365,529 | B1 | | 4/2002 | Hussein et al. ............. 438/780 |
| 6,376,366 | B1 | * | 4/2002 | Lin et al. ..................... 438/637 |
| 6,455,436 | B1 | * | 9/2002 | Ueda et al. .................. 438/706 |
| 6,479,391 | B2 | * | 11/2002 | Morrow et al. ............. 438/706 |

OTHER PUBLICATIONS

Roderick R. Kunz et al., "Materials Evaluation of Antireflective Coating for Single Layer 193–nm Lithography", Advances in Resist Technology and Processing XI, Proceedings SPIE–The International Society for Optical Engineering, Feb. 1994, vol. 2195, pp. 447–460, San Jose, CA.

* cited by examiner

Primary Examiner—Kin-Chan Chen  
(74) Attorney, Agent, or Firm—Mark V. Seeley

(57) ABSTRACT

An improved method of forming a semiconductor device is described. Initially, a structure is formed that includes first and second hard masking layers that cover a dielectric layer. A first part of the second hard masking layer and a first part of the first hard masking layer are etched to form an etched region within the hard mask that exposes a first portion of the dielectric layer. That etched region is filled with a sacrificial material. After etching through a second part of the second hard masking layer, the remainder of the sacrificial material is removed prior to subsequent processing.

20 Claims, 4 Drawing Sheets

METHOD FOR MAKING A DUAL DAMASCENE INTERCONNECT USING A DUAL HARD MASK

FIELD OF THE INVENTION

The present invention relates to a method for making semiconductor devices that include dual damascene interconnects.

BACKGROUND OF THE INVENTION

When a dual damascene process is used to make an interconnect structure for a semiconductor device, a via and a trench are formed within a dielectric layer. The via and trench are then filled with copper or another conductive material. In such a process, a dual hard mask, which includes lower and upper layers, may be formed on the dielectric layer prior to forming the via and trench. When such a dual hard mask defines the trench before the via, a relatively large part of the hard mask's upper layer is removed while the lower layer serves as an etch stop. A relatively small portion of the lower layer is then removed, and a via is partially etched through the underlying dielectric layer. After an adjoining portion of the lower layer is removed, the dielectric layer may be further etched to form within it the via and trench.

Such a process, which defines the trench before the via, leaves little room for error when lining up the via. Unless the via is lined up with part of the trench, an inoperable device will result. For that reason, it is desirable for a dual damascene process, which uses such a dual hard mask, to define the via before the trench. An example of such a process, which partially etches through a first portion of the dual hard mask's lower layer to define the via prior to defining the trench, is described in Ser. No. 09/746,035, filed Dec. 22, 2000, and assigned to this application's assignee. This particular process, however, may be relatively fragile and difficult to implement.

Accordingly, there is a need for a more robust dual damascene process, which uses a dual layer hard mask, that enables the via to be defined before the trench is defined. The method of the present invention provides such a process.

DETAILED DESCRIPTION OF THE PRESENT INVENTION

Figure 1A:
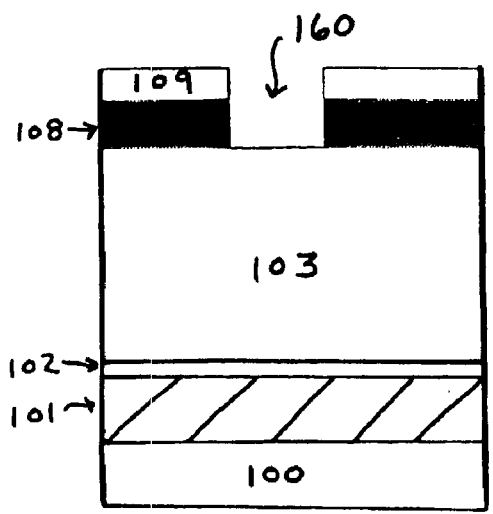
FIGS. 1a–1h illustrate cross-sections that reflect structures that may result after certain steps are used to make a dual damascene device following one embodiment of the method of the present invention.
Figure 1B:
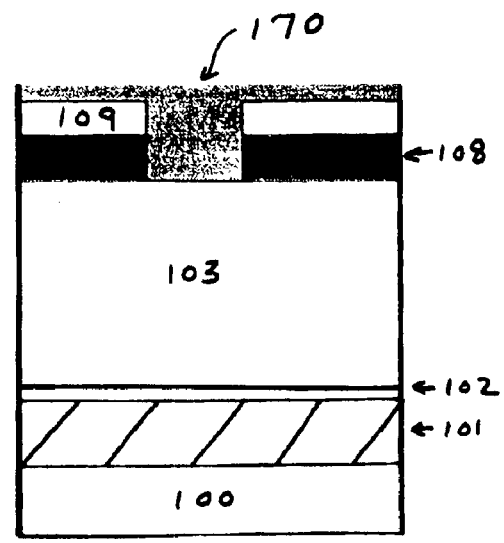

A method of forming a semiconductor device is described. That method comprises forming a dielectric layer on a substrate, then forming on the dielectric layer a hard mask that comprises a first hard masking layer that is formed on the dielectric layer and a second hard masking layer that is formed on the first hard masking layer. After forming an etched region within the hard mask that exposes a first portion of the dielectric layer, the etched region is filled with a sacrificial material. After etching through a second part of the second hard masking layer, substantially all of that sacrificial material is removed.

In one embodiment of the present invention, the dielectric layer comprises a single homogeneous material. In another embodiment, the dielectric layer comprises at least two layers. One of those layers may include an oxide based material, while the other may include an organic polymer. The organic polymer may be formed on the oxide based material, or, alternatively, the oxide based material may be formed on the organic polymer.

Set forth below is a description of embodiments of the method of the present invention, in which a dual hard mask is used to make a device that includes a dual damascene interconnect. That description is made with reference to FIGS. 1a–1h and 2a–2h, which represent cross-sections of structures that result after using certain steps. In the following description, numerous specific details are presented to provide a thorough understanding of the present invention. However, it will be apparent to those skilled in the art that the invention may be practiced in many ways other than those expressly described here. The invention is thus not limited by the specific details disclosed below.

In the embodiment that is illustrated in FIGS. 1a–1h, conductive layer 101 is formed on substrate 100. Substrate 100 may be any structure, generated when making a semiconductor device, upon which a conductive layer may be formed. Conductive layer 101 may be made from materials conventionally used to form conductive layers for semiconductor devices. For example, conductive layer 101 may be made from copper or a copper alloy. Conductive layer 101 may be formed using conventional processes that are well known to those skilled in the art.

Barrier layer 102 is formed on conductive layer 101. Barrier layer 102 will serve to prevent an unacceptable amount of copper, or other metal, from diffusing into dielectric layer 103. Barrier layer 102 also acts as an etch stop, protecting underlying conductive layer 101 during subsequent via and trench etch and cleaning steps. Barrier layer 102 preferably is made from silicon nitride, but may be made from other materials that can serve such functions, e.g., silicon carbide, silicon oxycarbide or silicon oxynitride. Barrier layer 102 may be formed using conventional processes.

Dielectric layer 103 is formed on top of barrier layer 102. In this embodiment of the present invention, dielectric layer 103 comprises a single homogeneous material. Dielectric layer 103 preferably has a dielectric constant that is less than about 3.5 and more preferably between about 1.0 and about 3.0. Dielectric layer 103 may comprise an oxide based material, e.g., a carbon doped oxide, a porous carbon doped oxide, a fluorine doped oxide, or a spin on glass. Alternatively, dielectric layer 103 may comprise an organic polymer, e.g., a polymer selected from the group that includes polyimides, parylenes, polyarylethers, polynaphthalenes, polyquinolines, bisbenzocyclobutene, polyphenylene, polyarylene, their copolymers or their porous polymers. Commercially available polymers, e.g., those sold by Honeywell, Inc., under the tradename FLARE™ and by the Dow Chemical Company under the tradenames SiLK™ and CYCLOTENE™, may be used to form dielectric layer 103.

Although preferably made from materials that may generate a dielectric layer with a dielectric constant that is less than about 3.5, dielectric layer 103 may be made from other materials that may insulate one conductive layer from another, e.g., silicon dioxide, as will be apparent to those skilled in the art. Dielectric layer 103 may be deposited on barrier layer 102 using a conventional chemical vapor deposition or spin-on process, depending upon the material used.

A dual hard mask is then formed on dielectric layer 103. That hard mask comprises a first hard masking layer 108 that is formed on dielectric layer 103 and a second hard masking layer 109 that is formed on first hard masking layer 108. As illustrated below, the presence of the dual hard mask enables different portions of dielectric layer 103 to be etched to different depths. First hard masking layer 108 may comprise silicon dioxide and second hard masking layer 109 may comprise silicon nitride. Alternatively, first hard masking layer 108 may comprise silicon nitride and second hard masking layer 109 may comprise silicon dioxide.

Whether the dual hard mask has a silicon nitride upper layer and a silicon dioxide lower layer, or a silicon dioxide upper layer and a silicon nitride lower layer, depends upon the application in which the dual hard mask is used. The material used to form dielectric layer 103 may also dictate the materials used to form layers 108 and 109. Although silicon nitride and silicon dioxide are preferred materials for forming the dual hard mask, other appropriate materials may be used instead, as long as one material may be etched selectively with respect to the other. For example, silicon oxyfluoride or carbon doped oxide may be used in place of silicon dioxide, and silicon carbide, silicon oxycarbide or silicon oxynitride may be used instead of silicon nitride. Layers 108 and 109 may be formed using conventional process steps.

After the dual hard mask is formed, a photoresist layer (not shown) is deposited and patterned on top of it to define a via to be etched through dielectric layer 103. That photoresist layer may be patterned using conventional photolithographic techniques. The patterned photoresist will leave exposed a first part of second hard masking layer 109. That exposed portion is then etched, e.g., by using a selective plasma etch step. If upper layer 109 comprises silicon nitride (or silicon carbide), and lower layer 108 comprises silicon dioxide, the exposed portion of layer 109 may be etched using a selective $CH_2F_2/O_2/Ar$, $CH_2F_2/N_2/Ar$, $CHF_3/O_2/Ar$, or $CHF_3/N_2/Ar$ based plasma. Such a plasma etch process should stop when it reaches silicon dioxide layer 108.

Alternatively, if upper layer 109 comprises silicon dioxide, and lower layer 108 comprises silicon nitride (or silicon carbide), the exposed portion of layer 109 may be etched using a selective $C_4F_8/CO/N_2/Ar$ based plasma. Such a plasma etch process should stop when it reaches silicon nitride (or silicon carbide) layer 108. (Unless indicated otherwise, the etching steps described in this application reflect anisotropic dry plasma etch processes.) After that etch step, the photoresist is removed. A conventional photoresist ashing step may be used to strip the resist, e.g., one that applies an oxygen and nitrogen containing plasma to remove it.

After the photoresist is stripped, a first part of first hard masking layer 108—exposed by removing part of second hard masking layer 109—is removed to form etched region 160 within the hard mask. Etched region 160 exposes a first portion of dielectric layer 103. First hard masking layer 108 should be etched with a plasma that will not remove a significant part of dielectric layer 103. In addition, the plasma used to remove lower layer 108 should not remove a significant part of upper layer 109. When dielectric layer 103 comprises an organic polymer, upper layer 109 comprises silicon nitride, and lower layer 108 comprises silicon dioxide, a $C_4F_8/O_2/Ar$ based plasma may be used to remove lower layer 108 selectively with respect to dielectric layer 103 and upper layer 109. The resulting structure is shown in FIG. 1a. (If, instead, lower layer 108 comprises silicon nitride and upper layer 109 comprises silicon dioxide, a plasma based on a chemistry that is selective to dielectric layer 103 and silicon dioxide may be used to remove silicon nitride layer 108, as will be apparent to those skilled in the art.)

After forming etched region 160, that region is filled with sacrificial material 170. Sacrificial material 170 may comprise a bottom anti-reflective coating ("BARC") or another type of sacrificial light absorbing material ("SLAM"). In a preferred embodiment, sacrificial material 170 is a SLAM that comprises a dyed spin-on-glass ("SOG") or dyed spin-on-polymer ("SOP"). Suitable dyed SOG materials may be obtained from Honeywell, Inc., and Tokyo Ohka Kogyo Co. Ltd. Sacrificial material 170 may be spin coated onto layer 109 in the conventional manner to generate the structure illustrated in FIG. 1b.

After filling etched region 160 with sacrificial layer 170, a second layer of photoresist 130 is deposited onto sacrificial material 170, then patterned to define the trench to be etched into dielectric layer 103. When (or after) patterning photoresist layer 130, part of the underlying sacrificial material 170 may be removed, leaving exposed a second part of second hard masking layer 109. That exposed part is then etched, generating the structure shown in FIG. 1c.

While the exposed second part of layer 109 is removed, sacrificial material 170 protects dielectric layer 103. To enable sacrificial material 170 to perform that function, the plasma used to etch the exposed part of layer 109 must be selective to sacrificial material 170. That plasma must also be selective to lower layer 108 to ensure that this process step will not adversely affect dielectric layer 103. If layer 109 comprises silicon nitride, a $CH_2F_2/O_2/Ar$ or $CHF_3/O_2/Ar$ based plasma may be used to remove the exposed portion of layer 109. If layer 109 instead comprises silicon dioxide, a $C_4F_8/CO/N_2/Ar$ based plasma may be used.

Figure 1C:
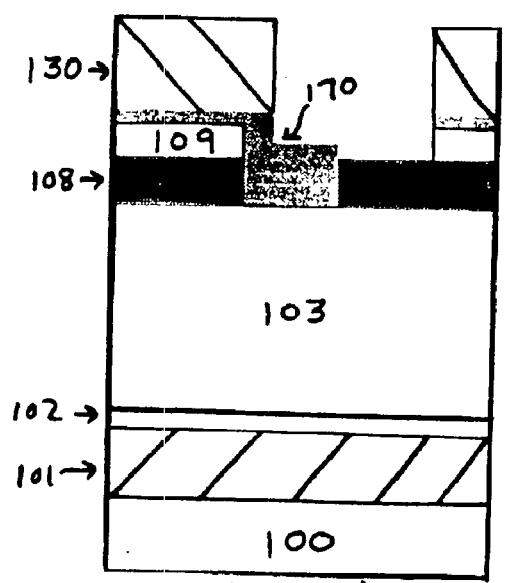
Figure 1D:
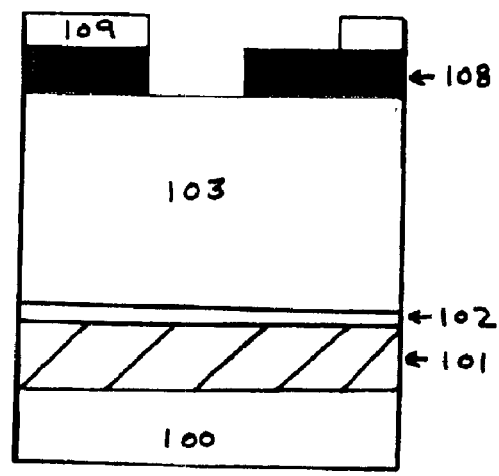

FIG. 1c shows how the patterned photoresist layer 130 may be misaligned with respect to etched region 160, without any adverse impact. As long as part of the region that layer 130 exposes lines up with part of etched region 160, an acceptable trench and via structure may ultimately result. The process of the present invention thus enables an increased alignment budget, when compared to a process that performs trench lithography before via lithography.

After removing the exposed second part of layer 109, photoresist layer 130 and substantially all of the remaining sacrificial material 170 are removed. A conventional oxygen based ashing step may be used to remove the photoresist, and a conventional wet etch process may be used to remove sacrificial material 170. Alternatively, depending upon the materials used for sacrificial material 170 and dielectric layer 103, and the process used to remove photoresist layer 130, the photoresist and sacrificial material may be removed at the same time. The FIG. 1d structure results, when the photoresist and sacrificial material are removed.

Figure 1E:
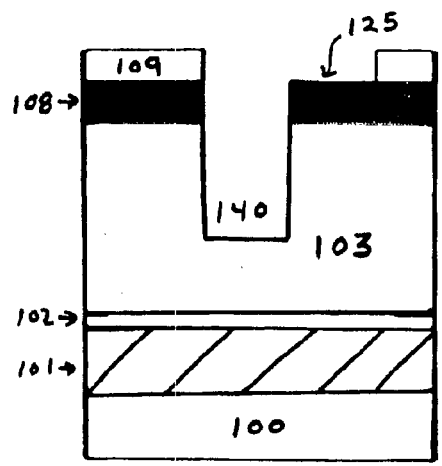
Figure 1F:
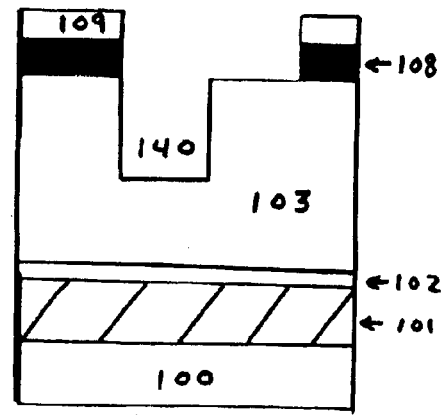
Figure 1G:
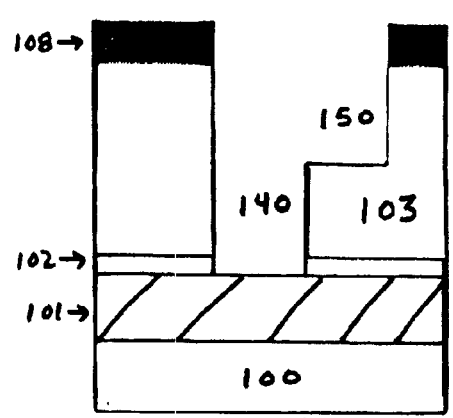

In one embodiment, after photoresist layer 130 and sacrificial material 170 are removed, a first part of via 140 is etched into dielectric layer 103 to generate the structure shown in FIG. 1e. When dielectric layer 103 comprises a polymer based film, a plasma formed from a mixture of oxygen, nitrogen, and carbon monoxide may be used to perform that etch step. That process terminates when via 140 reaches a first depth within dielectric layer 103. This ensures that a subsequent process step for etching the trench will not extend the via through barrier layer 102. (In an alternative embodiment, when selectivity is relatively high, the via may be etched down to barrier layer 102 instead of only part way through dielectric layer 103.) Following that via etch step, section 125 of first hard masking layer 108 is removed. If layer 108 comprises silicon dioxide, then a $C_4F_8/O_2/Ar$ based plasma may be used. This generates the FIG. 1f structure.

Trench 150 is then etched into dielectric layer 103. A process like the one used to etch via 140 into (or through) dielectric layer 103 may be used to etch trench 150. Although the via and trench etch processes may use the same chemistry, the trench etch step should be performed at a different pressure using different flow rates. The trench etch process is applied for a time sufficient to form a trench having the desired depth. When trench 150 and a remaining portion of via 140 are etched at the same time, the etch chemistry chosen to etch trench 150 does not necessarily have to be highly selective to barrier layer 102. If the trench etch terminates at about the time the via etch reaches the barrier layer, barrier layer 102 will not be subjected to that etch process for a significant length of time.

This may provide significant benefits. Because the process of the present invention reduces the amount of time during which barrier layer 102 is etched during the trench etch process, the thickness of barrier layer 102 (e.g., a silicon nitride layer), when initially deposited, may be reduced to less than about 500 angstroms. Reducing the thickness of that layer may help reduce the dielectric constant for the insulating material. In addition, this circumstance enables use of an etch chemistry that may generate vias and trenches with improved, substantially vertical, profiles—without having to consider selectivity to the dielectric layer and the underlying barrier layer. For example, if dielectric layer 103 comprises a polymer based film and barrier layer 102 comprises silicon nitride, it may be desirable to use an etch chemistry that yields improved trench and via profiles without having to worry about its selectivity to silicon nitride.

A conventional post etch via and trench cleaning step may follow to clean via 140 and trench 150. Barrier layer 102 protects conductive layer 101 from exposure to any solvents used during such a cleaning step. The portion of barrier layer 102 that separates via 140 from conductive layer 101 may then be removed to expose conductive layer 101. If barrier layer 102 and second hard masking layer 109 are made from the same material, then the remainder of second hard masking layer 109 may be removed at the same time that portion of barrier layer 102 is etched to produce the structure illustrated in FIG. 1g.

Following that barrier layer removal step, trench 150 and via 140 are filled with a conductive material to form second conductive layer 105. That conductive material may comprise the same substance as conductive layer 101, or may comprise a substance different from that used to make conductive layer 101. The resulting conductive layer 105 preferably comprises copper, and may be formed using a conventional copper electroplating process. As with conductive layer 101, although copper is preferred, conductive layer 105 may be formed from other materials.

Figure 1H:
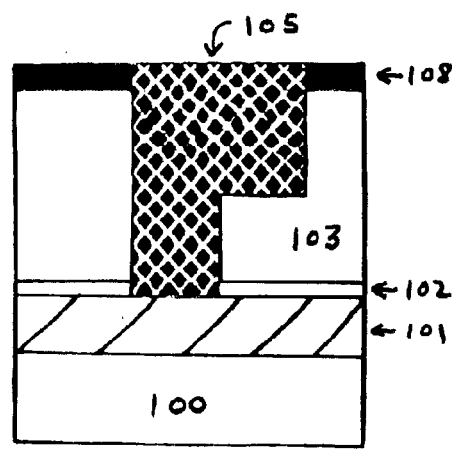

A CMP step may be applied to remove any excess material and to planarize the surface of layer 105, generating the FIG. 1h structure. Although the embodiment shown in FIG. 1h shows only one dielectric layer and two conductive layers, the process described above may be repeated to form additional conductive and insulating layers until the desired semiconductor device is produced.

Figure 2A:
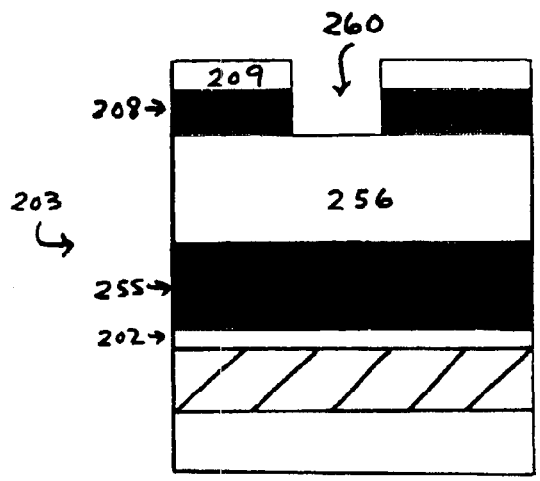
FIGS. 2a–2h illustrate cross-sections that reflect structures that may result after certain steps are used to make a dual damascene device following a second embodiment of the method of the present invention.
Figure 2B:
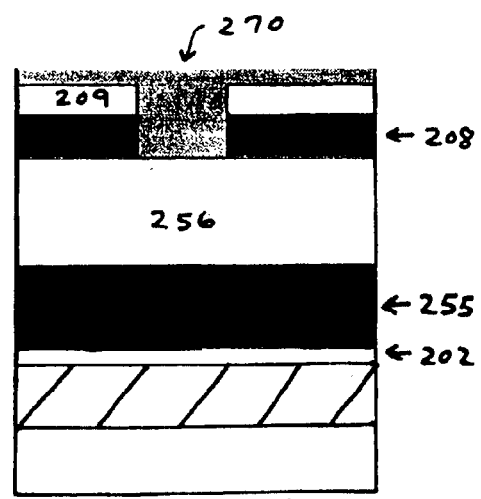
Figure 2C:
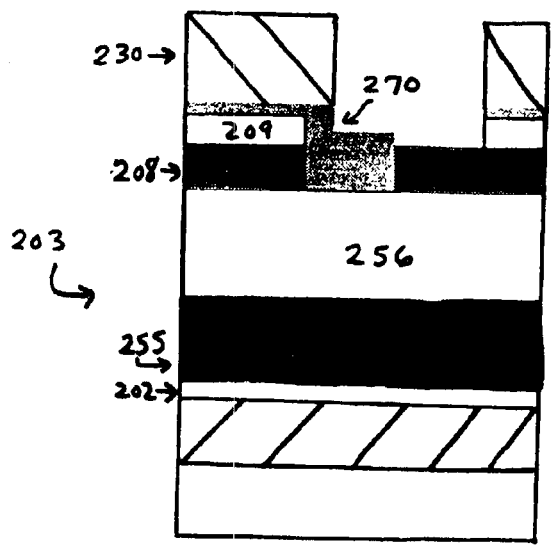
Figure 2D:
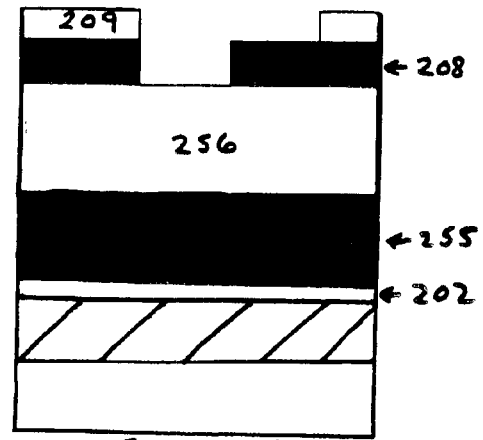

FIGS. 2a–2h illustrate a variation of the process described above in connection with FIGS. 1a–1h. In this variation, FIG. 2a shows a structure like the one shown in FIG. 1a, except that dielectric layer 203 comprises two layers. One layer may include an oxide based material, while the other may include an organic polymer. The organic polymer may be formed on the oxide based material, or, alternatively, the oxide based material may be formed on the organic polymer. When lower layer 255 comprises an oxide based layer (e.g., a layer that includes silicon dioxide, SiOF, carbon doped oxide, or a SOG), that layer may be formed on barrier layer 202 in the conventional manner (e.g., by a conventional spin-on or CVD process), prior to applying polymer based film 256 to layer 255 using a conventional spin-on process.

In a preferred embodiment, film 256 and layer 255 have similar dielectric constants to ensure low line-to-line capacitance. The FIG. 2a structure may be produced by deposited and patterning a photoresist layer to expose part of layer 209, etching through layer 209, removing the photoresist, and etching through layer 208 to form etched region 260, as described above in connection with FIG. 1a. After forming etched region 260, that region is filled with sacrificial material 270, as described above in connection with FIG. 1b, to generate the FIG. 2b structure.

After filling etched region 260 with sacrificial layer 270, a second layer of photoresist 230 is deposited and patterned to define the trench to be etched into dielectric layer 203. When (or after) patterning photoresist layer 230, part of underlying sacrificial material 270 is removed, leaving exposed a second part of second hard masking layer 209. The exposed second part of second hard masking layer 209 is then etched to generate the FIG. 2c structure. The remaining photoresist, and sacrificial material, are then removed to generate the structure illustrated in FIG. 2d.

Figure 2E:
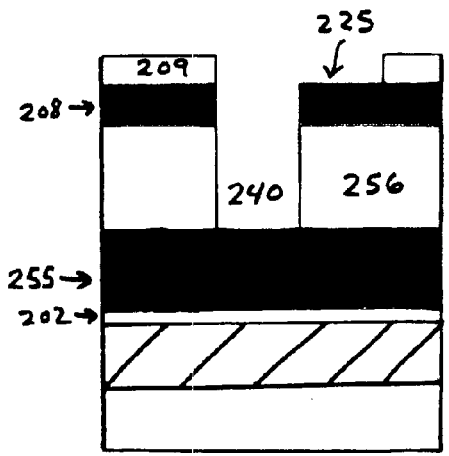
Figure 2F:
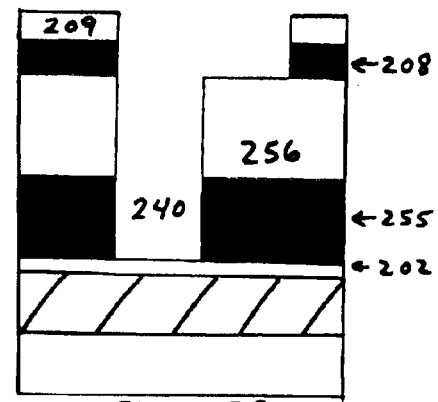
Figure 2G:
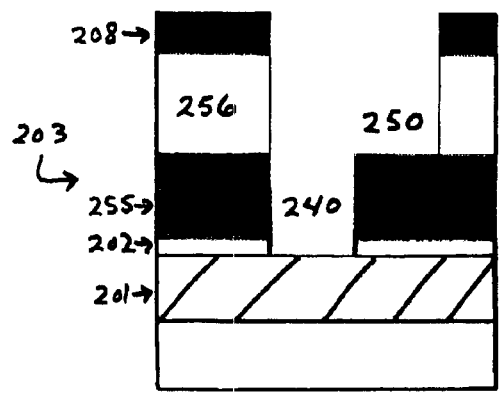
Figure 2H:
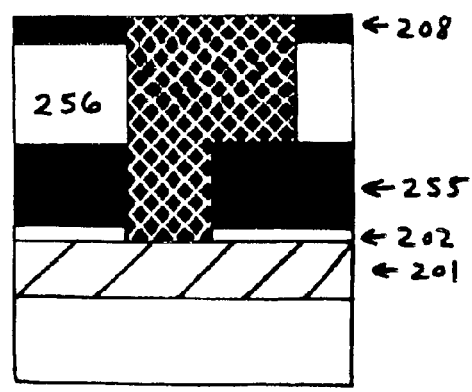

A first part of via 240 is etched through film 256 until it reaches oxide based layer 255, generating the structure shown in FIG. 2e. A plasma generated from a mixture of oxygen, nitrogen, and carbon monoxide may be used to perform that etch step. That process may stop when via 240 reaches layer 255 because of the high selectivity of that etch chemistry to that layer. Following that via etch step, section 225 of layer 208 is removed—using, for example, a $C_4F_8/O_2/Ar$ based plasma. In one embodiment, that process step, in addition to removing section 225, etches into the exposed part of oxide based layer 255—extending via 240 to barrier layer 202 and generating the structure shown in FIG. 2f. (In other embodiments, it may be necessary to further etch via 240 through layer 255 after section 225 of layer 208 is removed—depending upon layer thicknesses and selectivities.)

Trench 250 is then etched into dielectric layer 203. A process like the one used to etch via 240 through polymer based film 256 may be used to etch trench 250 through that film. The via and trench etch processes may use the same chemistry, but be performed at different pressures using different flow rates. As with the via etch step, the trench etch process will stop when the trench reaches layer 255 because of the high selectivity of that etch chemistry to that layer. The etch chemistry chosen to etch trench 250 should also be highly selective to barrier layer 202 to ensure that the trench etch step will not etch through that layer.

After applying a conventional post etch via and trench cleaning step, the portion of barrier layer 202 that separates via 240 from conductive layer 201 may be removed to expose conductive layer 201. If barrier layer 202 and second hard masking layer 209 are made from the same material, then the remainder of second hard masking layer 209 may be removed at the same time that portion of barrier layer 202 is etched to produce the structure illustrated in FIG. 2g. Via 240 and trench 250 may then be filled with a conductive material to produce the FIG. 2h structure.

Using a composite dielectric layer, which enables the trench to be formed within the relatively soft polymer based film and the via to be formed within the harder oxide based layer, should enhance the resulting structure's mechanical integrity, rendering it more durable. That property should enable this structure to withstand stresses that will be applied during device fabrication, testing and packaging. Another benefit from using such a composite dielectric layer is that the via profile may be preserved during the trench etch process because of the high selectivity of the etch chemistry to the oxide based layer.

The improved method for making a semiconductor device of the present invention, which performs via lithography prior to trench lithography to make a dual damascene structure using a dual layer hard mask, increases the alignment budget for via and trench formation. When the dielectric layer includes an oxide based layer that is covered by a polymer based film, the method of the present invention also promotes superior via and trench profiles and increased mechanical strength.

Although the foregoing description has specified certain steps and materials that may be used in such a method to make a semiconductor device, those skilled in the art will appreciate that many modifications and substitutions may be made. For example, as already indicated, the dielectric layer may comprise an oxide based upper layer and a polymer based lower layer instead of a polymer based upper layer and an oxide based lower layer. Similarly, the hard mask may comprise a silicon dioxide upper layer and silicon nitride lower layer instead of a silicon nitride upper layer and silicon dioxide lower layer. Accordingly, it is intended that all such modifications, alterations, substitutions and additions be considered to fall within the spirit and scope of the invention as defined by the appended claims.

What is claimed is:

1. A method of forming a semiconductor device comprising:
   forming a dielectric layer on a substrate;
   forming on the dielectric layer a hard mask that comprises a first hard masking layer that is formed on the dielectric layer and a second hard masking layer that is formed on the first hard masking layer;
   etching through a first part of the second hard masking layer and a first part of the first hard masking layer to form an etched region within the hard mask that exposes a first portion of the dielectric layer;
   filling the etched region with a sacrificial material;
   etching through a second part of the second hard masking layer; and then removing substantially all of the sacrificial material.

2. The method of claim 1 wherein the dielectric layer has a dielectric constant that is less than about 3.5.

3. The method of claim 2 wherein the dielectric layer comprises an organic polymer that is selected from the group consisting of polyimides, parylenes, polyarylethers, polynaphthalenes, polyquinolines, bisbenzocyclobutene, polyphenylene, polyarylene, their copolymers and their porous polymers.

4. The method of claim 2 wherein the dielectric layer comprises an oxide based material that is selected from the group consisting of a carbon doped oxide, a porous carbon doped oxide, a fluorine doped oxide, and a spin on glass.

5. The method of claim 2 wherein the dielectric layer comprises a first layer and a second layer, the first layer comprising an organic polymer and the second layer comprising an oxide based material.

6. The method of claim 5 wherein the first layer is formed on the second layer.

7. The method of claim 6 further comprising, after removing the sacrificial material:
   etching a via through the first layer and the second layer and etching a trench through the first layer; and
   filling the via and trench with a conductive material.

8. The method of claim 5 wherein the second layer is formed on the first layer.

9. The method of claim 2 wherein the dielectric layer comprises a single layer and further comprising, after removing the sacrificial material:
   etching into the exposed first portion of the dielectric layer to a first depth;
   etching through a second portion of the first hard masking layer to expose a second portion of the dielectric layer;
   etching into both the first and second exposed portions of the dielectric layer to form a via and trench; and
   filling the via and trench with a conductive material.

10. The method of claim 1 wherein the first hard masking layer includes a material that is selected from the group consisting of silicon dioxide, silicon oxyfluoride, and carbon doped oxide, and the second hard masking layer includes a material that is selected from the group consisting of silicon nitride, silicon carbide, silicon oxycarbide, and silicon oxynitride.

11. The method of claim 1 wherein the first hard masking layer includes a material that is selected from the group consisting of silicon nitride, silicon carbide, silicon oxycarbide, and silicon oxynitride, and the second hard masking layer includes a material that is selected from the group consisting of silicon dioxide, silicon oxyfluoride, and carbon doped oxide.

12. A method of forming a semiconductor device comprising:
   forming a conductive layer on a substrate;
   forming a barrier layer on the conductive layer;
   forming a first dielectric layer on the barrier layer;
   forming a second dielectric layer on the first dielectric layer;
   forming a first hard masking layer on the second dielectric layer;
   forming a second hard masking layer on the first hard masking layer;
   depositing a first layer of photoresist and then patterning that first layer to expose a first part of the second hard masking layer to define a first region to be etched through the second dielectric layer;
   etching through the exposed first part of the second hard masking layer and an underlying first part of the first hard masking layer to form an etched region that exposes a first portion of the second dielectric layer;
   filling the etched region with a sacrificial material;
   depositing a second layer of photoresist and then patterning that second layer to define a second region to be etched through the second dielectric layer;
   etching through a second part of the second hard masking layer;
   removing substantially all of the sacrificial material;
   etching a via through the first and second dielectric layers and etching a trench through the second dielectric layer; and
   filling the via and trench with a conductive material.

13. The method of claim 12 further comprising removing part of the barrier layer before filling the via and trench with the conductive material.

14. The method of claim 13 further comprising, after removing the sacrificial material:
etching the via through the second dielectric layer; then
etching the via through at least part of the first dielectric layer at the same time a second portion of the first hard masking layer is removed to expose a second portion of the second dielectric layer; and
etching through the second exposed portion of the second dielectric layer to form the trench.

15. The method of claim 12 wherein the first dielectric layer comprises an organic polymer and the second dielectric layer comprising an oxide based material.

16. The method of claim 12 wherein the first dielectric layer comprises an oxide based material and the second dielectric layer comprising an organic polymer.

17. A method of forming a semiconductor device comprising:
forming a conductive layer on a substrate;
forming a barrier layer on the conductive layer;
forming a dielectric layer on the barrier layer;
forming on the dielectric layer a hard mask that comprises a first hard masking layer that is formed on the dielectric layer and a second hard masking layer that is formed on the first hard masking layer;
depositing a first layer of photoresist and then patterning that first layer to expose a first part of the second hard masking layer to define a via;
etching through the exposed first part of the second hard masking layer and an underlying first part of the first hard masking layer to form an etched region within the hard mask that exposes a first portion of the dielectric layer;
filling the etched region with a sacrificial material;
depositing a second layer of photoresist and then patterning that second layer to define a trench;
etching through a second part of the second hard masking layer;
removing substantially all of the sacrificial material;
etching into the exposed first portion of the dielectric layer to a first depth;
etching through a second portion of the first hard masking layer to expose a second portion of the dielectric layer;
etching into both the first and second exposed portions of the dielectric layer to form a via and trench; and
filling the via and trench with a conductive material.

18. The method of claim 17 wherein the dielectric layer has a dielectric constant that is less than about 3.5, and comprises an organic polymer that is selected from the group consisting of polyimides, parylenes, polyarylethers, polynaphthalenes, polyquinolines, bisbenzocyclobutene, polyphenylene, polyarylene, their copolymers and their porous polymers or an oxide based material that is selected from the group consisting of a carbon doped oxide, a porous carbon doped oxide, a fluorine doped oxide, and a spin on glass.

19. The method of claim 17 wherein the first hard masking layer includes a material that is selected from the group consisting of silicon dioxide, silicon oxyfluoride, and carbon doped oxide, and the second hard masking layer includes a material that is selected from the group consisting of silicon nitride, silicon carbide, silicon oxycarbide, and silicon oxynitride.

20. The method of claim 17 wherein the first hard masking layer includes a material that is selected from the group consisting of silicon nitride, silicon carbide, silicon oxycarbide, and silicon oxynitride, and the second hard masking layer includes a material that is selected from the group consisting of silicon dioxide, silicon oxyfluoride, and carbon doped oxide.

* * * * *